US009793227B1

(12) United States Patent
Sharma

(10) Patent No.: US 9,793,227 B1
(45) Date of Patent: Oct. 17, 2017

(54) SWITCHABLE DIE SEAL CONNECTION

(71) Applicant: Peregrine Semiconductor Corporation, San Diego, CA (US)

(72) Inventor: Vikas Sharma, Reading (GB)

(73) Assignee: Peregrine Semiconductor San Diego, San Diego, CA (US)

( * ) Notice: Subject to any disclaimer, the term of this patent is extended or adjusted under 35 U.S.C. 154(b) by 9 days.

(21) Appl. No.: 15/135,374

(22) Filed: Apr. 21, 2016

(51) Int. Cl.
   *H01L 23/66* (2006.01)
   *H01L 23/58* (2006.01)
   *H01L 23/528* (2006.01)
   *H01L 27/12* (2006.01)
   *H01L 21/768* (2006.01)
   *H01L 21/84* (2006.01)
   *H03H 7/01* (2006.01)

(52) U.S. Cl.
   CPC ........ *H01L 23/66* (2013.01); *H01L 21/76895* (2013.01); *H01L 21/84* (2013.01); *H01L 23/5286* (2013.01); *H01L 23/585* (2013.01); *H01L 27/1203* (2013.01); *H03H 7/01* (2013.01); *H01L 2223/6605* (2013.01); *H03H 2007/013* (2013.01)

(58) Field of Classification Search
   CPC ........ H01L 2223/6605; H01L 27/1203; H01L 21/84; H01L 21/76895; H01L 23/585; H01L 23/5286; H01L 23/66; H03H 2007/013; H03H 7/01
   See application file for complete search history.

(56) References Cited

U.S. PATENT DOCUMENTS

| 5,401,912 | A  | * | 3/1995  | Mattei     | H01L 23/66   |
|           |    |   |         |            | 174/255      |
| 6,172,412 | B1 | * | 1/2001  | Wein       | H01L 21/67121|
|           |    |   |         |            | 257/664      |
| 6,225,696 | B1 | * | 5/2001  | Hathaway   | H01L 23/66   |
|           |    |   |         |            | 257/703      |
| 7,382,039 | B2 | * | 6/2008  | Hollenbeck | H01L 23/585  |
|           |    |   |         |            | 257/620      |
| 7,535,062 | B2 |   | 5/2009  | Maki et al.|              |
| 7,615,841 | B2 | * | 11/2009 | Chen       | H01L 23/5225 |
|           |    |   |         |            | 257/508      |

(Continued)

OTHER PUBLICATIONS

Sharma, Vikas, "Grounded Die Seal Integrated Circuit Structure for RF Circuits", U.S. Appl. No. 15/135,190, filed Apr. 21, 2016, 24 pgs.

*Primary Examiner* — Earl Taylor
(74) *Attorney, Agent, or Firm* — Jaquez Land Greenhaus LLP; Martin J. Jaquez, Esq.; John Land, Esq.

(57) ABSTRACT

An integrated circuit (IC) structure for radio frequency (RF) circuits having a multi-point selectably grounded die seal and multi-point selectably grounded signal paths. Embodiments include switch-coupled grounding pads that can selectively electrically couple an internal grounding pad within the die seal of an IC die to a connection point on the die seal and/or on a signal path. When the IC die is embedded in a grounded system, the die seal and/or signal path can be locally grounded at selected connection points, and thus an IC die may be "tuned" to mitigate the effects of parasitic coupling and/or to selective repurpose such parasitic coupling to generate a notch filter effect. Another aspect is selective grounding of inactive signal paths to improve isolation between signal ports.

20 Claims, 6 Drawing Sheets

(56) References Cited

U.S. PATENT DOCUMENTS

| | | | |
|---|---|---|---|
| 7,667,302 B1* | 2/2010 | Chang | H01L 23/5225 |
| | | | 257/508 |
| 7,760,144 B2* | 7/2010 | Chang | H01L 23/585 |
| | | | 340/572.7 |
| 8,395,239 B2* | 3/2013 | Chen | H01L 23/585 |
| | | | 257/619 |
| 9,431,338 B2* | 8/2016 | Priel | H01L 23/5223 |
| 9,496,231 B1* | 11/2016 | Tsai | H01L 23/585 |
| 9,640,494 B1* | 5/2017 | Sharma | H01L 23/66 |
| 2004/0075174 A1* | 4/2004 | Tamaru | H01L 21/76829 |
| | | | 257/758 |
| 2007/0158691 A1* | 7/2007 | Maki | H01L 21/743 |
| | | | 257/211 |
| 2008/0129623 A1* | 6/2008 | Barry | H01Q 1/2283 |
| | | | 343/741 |
| 2009/0134500 A1* | 5/2009 | Kuo | H01L 23/481 |
| | | | 257/659 |
| 2012/0104594 A1* | 5/2012 | Chen | H01L 23/585 |
| | | | 257/737 |
| 2013/0087914 A1* | 4/2013 | Yang | H01L 23/3114 |
| | | | 257/738 |
| 2013/0119449 A1* | 5/2013 | Chen | H01L 29/93 |
| | | | 257/312 |
| 2016/0104683 A1* | 4/2016 | Lin | H01L 27/0292 |
| | | | 257/532 |
| 2016/0240475 A1* | 8/2016 | Park | H01L 23/5286 |
| 2016/0372427 A1* | 12/2016 | Altunkilic | H01F 17/0013 |
| 2017/0025368 A1* | 1/2017 | Brindle | H01L 23/585 |
| 2017/0062353 A1* | 3/2017 | Tang | H01L 23/552 |
| 2017/0170263 A1* | 6/2017 | Zhong | H01L 29/0623 |

* cited by examiner

SWITCHABLE DIE SEAL CONNECTION

BACKGROUND

(1) Technical Field

This invention relates to integrated circuit die seal structures for electronic circuits, and particularly to integrated circuit die seal structures for RF circuits.

(2) Background

As is known in the field of integrated circuit (IC) fabrication, a semiconductor die (also known as a "chip") may include a die seal. A die seal is generally an electrically conductive ring integrally formed as part of a die at or near an outer edge region of a circuit-bearing planar surface of the die. A die seal is designed to protect an IC from contaminants that may affect the die yield during processing and affect performance of an IC after fabrication, and to make the die less susceptible to mechanical stress caused by a die saw. Some IC implementation technologies, such as CMOS, are especially prone to contamination, and thus generally include a die seal. In CMOS-based RF circuits, it is common to make the die seal floating (i.e., having no electrical connection).

FIG. 1 is a top view of one example of a prior art stylized integrated circuit die 100 having a peripheral die seal 102. The illustrated example includes a two-port radio frequency (RF) single-pole, double-throw (SPDT) switch as an illustrative circuit. A common port CP may be selectively coupled to either port P1 or to port P2 by closing a corresponding switch SW1 or SW2 while opening the other switch. The switches SWn are typically implemented as field effect transistors (FETs) controlled by other circuitry (not shown). For simplicity, the switches SWn are shown schematically rather than as physical structures on the IC die 100. As is known, a FET switch behaves as a low impedance resistor when closed, and as a capacitor when open.

The ports CP, P1, P2 are typically electrically conductive connection regions or pads often placed adjacent an edge of the IC die 100 to facilitate connection to electrically conductive bonding pads (which may be on the other side of the IC die 100, connected by vias) for further connection to external circuitry, such as by wire bonding or flip-chip solder bumps. In order to improve isolation of the various circuit components (e.g., the switches SWn and ports) from each other, the components are typically spaced from each other around the periphery of the die 100, but within the die seal 102. In addition, it is common to place ground pads G along the edges of the IC die 100 to facilitate coupling internal circuit elements through corresponding electrically conductive bonding pads to an external circuit ground.

One application for the illustrated IC die 100 is in a radio system. For example, the common port CP may be connected to an antenna, an RF transmitter circuit may be connected to port P1, and an RF receiver circuit may be connected to port P2. However, for RF circuits operating at high frequencies (especially frequencies equal to or greater than about 10 GHz), the die seal 102 can couple the fundamental energy emanating from activate internal circuitry and reroute such energy to unwanted signal paths, which can subsequently degrade key performance parameters (e.g., isolation, insertion loss, etc.).

In the illustrated configuration, when FET switch SW1 is open (thus behaving as a capacitor), the common port CP is decoupled from port P1; conversely, when FET switch SW2 is closed (thus behaving as a low impedance resistor), the common port CP is coupled to port P2. If the common port CP is coupled to an external antenna and port P2 is coupled to an RF receiver circuit, RF electromagnetic energy picked up by the antenna would flow along the intended signal path from the common port CP to the receiver port P2, as indicated by the arrow 104. However, that RF electromagnetic energy is inductively coupled to the floating die seal 102 and induces an opposite flow of parasitic energy around the entire die seal 102, as indicated by the arrow 106. The parasitic energy carried by die seal 102 then induces an opposite and unintended flow of parasitic energy in the signal path from the nominally decoupled port P1 to the common port CP via capacitive coupling, as indicated by the arrow 108. The parasitically coupled energy from the die seal 102 thus generally degrades the isolation between the signal ports P1 and P2. Further details of such coupling can be found in U.S. patent application Ser. No. 15/135,190, entitled "Grounded Die Seal Integrated Circuit Structure for RF Circuits", filed on Apr. 21, 2016 and assigned to the assigned of the present invention, which is incorporated herein by this reference.

Accordingly, there is a need for an integrated circuit structure for RF circuits that mitigates the effects of parasitic coupling through a die seal. The present invention meets this need.

SUMMARY OF THE INVENTION

The invention provides an integrated circuit (IC) structure for radio frequency (RF) circuits having a multi-point selectably grounded die seal that mitigates the effects of parasitic coupling through the die seal while also enabling selective repurposing of such parasitic coupling to generate a notch filter effect. Another aspect of the invention is selective grounding of inactive signal paths to improve isolation. Embodiments of the invention may be generally used for RF integrated circuits such as switches, mixers, phase shifters, digital step attenuators, digitally tunable capacitor and inductors, etc., but are particularly useful in conjunction with RF circuitry fabricated on high-Q (low loss) substrates, such as silicon-on-insulator (SOI) substrates (which include silicon-on-sapphire substrates), which are particularly prone to parasitic signal coupling at high frequencies (especially frequencies equal to or greater than about 10 GHz).

Embodiments of the invention include multiple switch-coupled grounding pads that can selectively electrically couple an internal grounding pad on an IC die to a connection point on the die seal and/or on a signal path. The location of the ground connection to the die seal is within the magnetic loop formed by the die seal ring. When the IC die is embedded in a grounded system, the die seal can be locally grounded at selected connection points. Induced parasitic energy within the die seal ring can be quickly coupled to ground through the corresponding grounding ties and grounding pads.

The location and connection state of grounding points within such an IC can have a significant effect on circuit performance. This characteristic can be used to "tune" an IC die to mitigate the effects of parasitic coupling, to selective repurpose such parasitic coupling to generate a notch filter effect, and/or to improve isolation between signal ports.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The invention provides an integrated circuit (IC) structure for radio frequency (RF) circuits having a multi-point selectably grounded die seal that mitigates the effects of parasitic coupling through the die seal while also enabling selective repurposing of such parasitic coupling to generate a notch filter effect. Another aspect of the invention is selective grounding of inactive signal paths to improve isolation. Embodiments of the invention may be generally used for RF integrated circuits such as switches, mixers, phase shifters, digital step attenuators, digitally tunable capacitor and inductors, etc., but are particularly useful in conjunction with RF circuitry fabricated on high-Q (low loss) substrates, such as silicon-on-insulator (SOI) substrates (which include silicon-on-sapphire substrates), which are particularly prone to parasitic signal coupling at high frequencies (especially frequencies equal to or greater than about 10 GHz).

Figure 1:
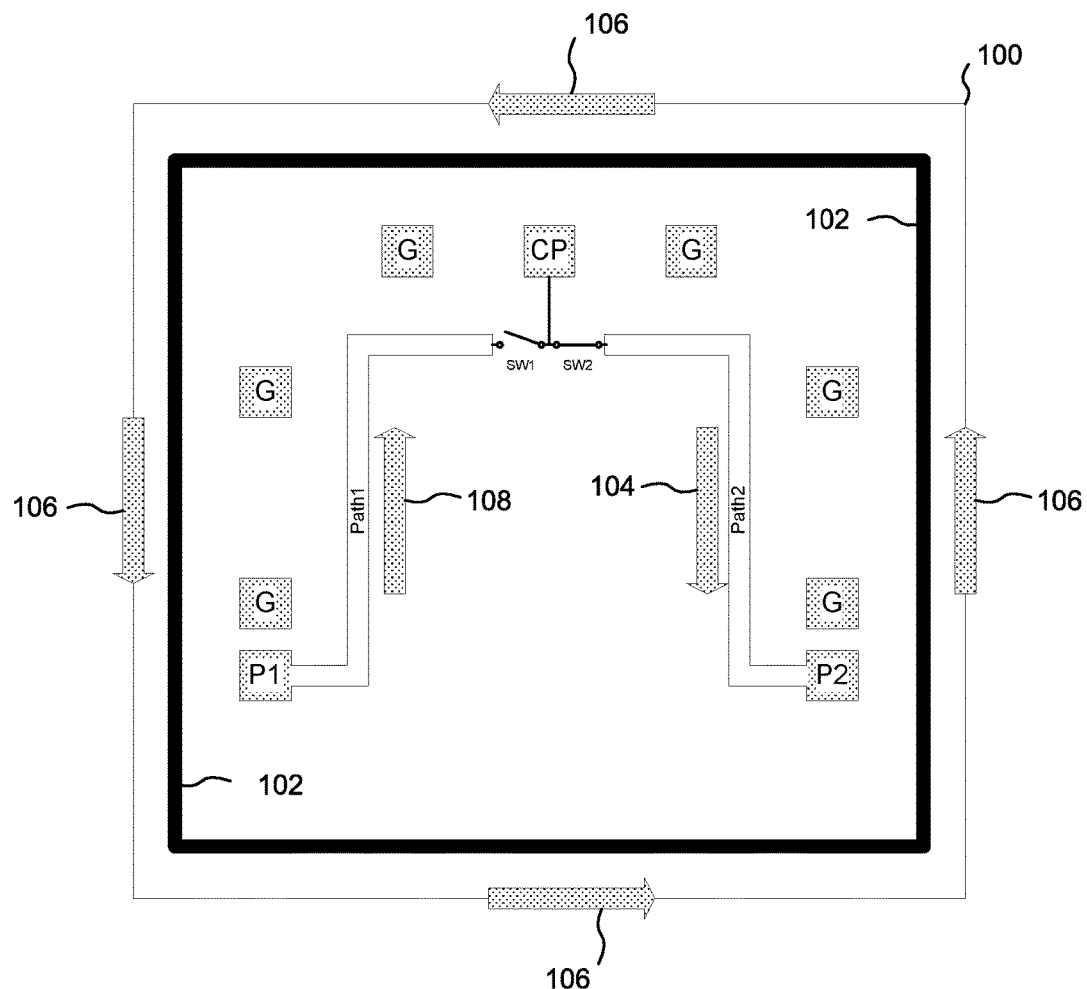
FIG. 1 is a top view of one example of a prior art stylized integrated circuit die having a peripheral die seal.
Figure 2:
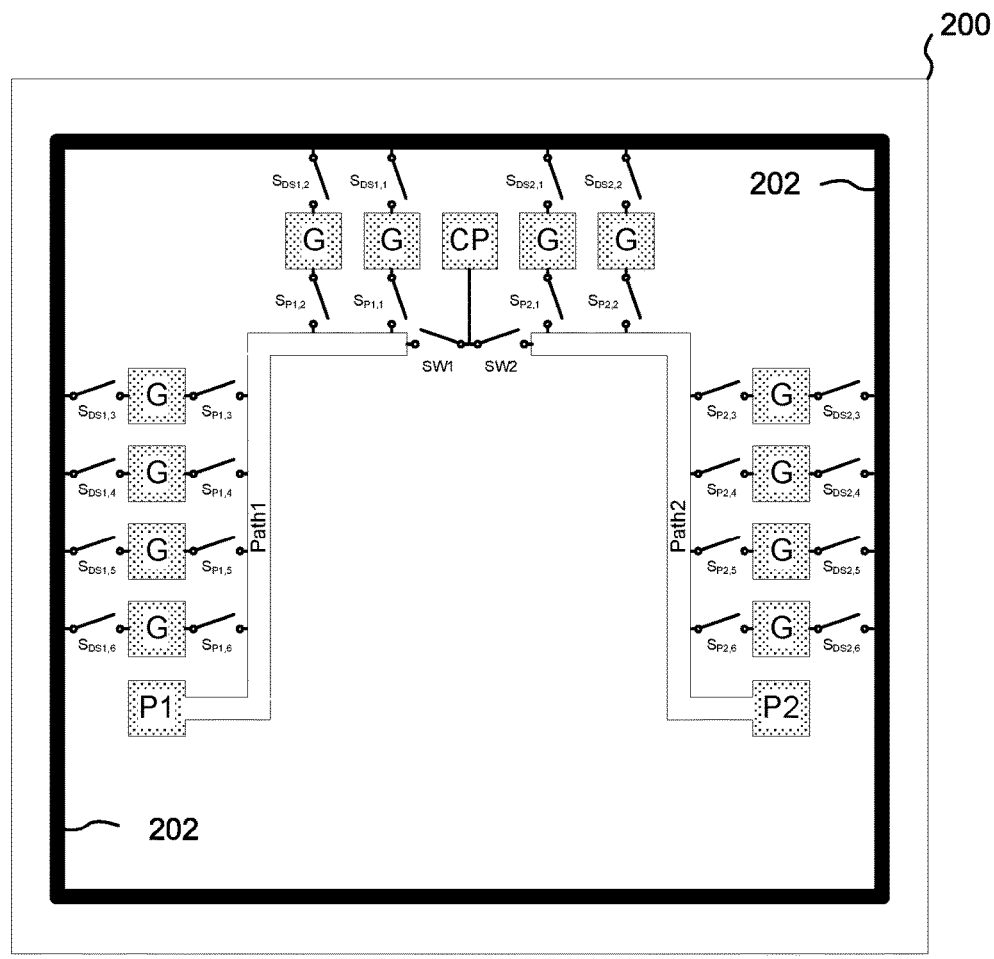
FIG. 2 is a top view of one embodiment of a stylized integrated circuit die having a peripheral multi-point selectably grounded die seal in accordance with the present invention.

FIG. 2 is a top view of one embodiment of a stylized integrated circuit die 200 having a peripheral multi-point selectably grounded die seal 202 in accordance with the present invention. As in FIG. 1, the illustrated embodiment includes a two-port radio frequency (RF) single-pole, double-throw (SPDT) switch as an illustrative circuit. A common port CP may be selectively coupled to port P1 along a signal path, Path1, by activating (closing) switch SW1, or to port P2 along a signal path, Path2, by activating (switch) SW2. The switches SWn are typically implemented as field effect transistors (FETs) controlled by other circuitry (not shown); for simplicity, the switches SWn are shown schematically rather than as physical structures on the IC die 200. However, the invention is not limited to FET switches, but encompasses other switch technologies that exhibit capacitive coupling characteristics, such as microelectromechanical system (MEMS) switches. The ports CP, P1, P2 are electrically conductive regions or pads often placed adjacent an edge of the IC die 200 to facilitate connection to electrically conductive bonding pads (which may be on the other side of the IC die 200, connected by vias) for further connection to external circuitry, such as by wire bonding or solder bumps.

A number of ground pads G are positioned on the IC die 200 to facilitate coupling internal circuit elements through corresponding electrically conductive bonding pads to an external circuit ground. The grounding pads G are generally located within the loop formed by the ring of the die seal 302, and can be connected to circuit ground through backside bonding pads connected by vias, or through solder bumps deposited on the grounding pads G, or through some equivalent connection.

Some of the ground pads G may be dedicated to selectably grounding either or both of an extent of the die seal 202 or of an associated signal path in accordance with the present invention. The illustrated embodiment depicts twelve ground pads G that are dedicated to that purpose (twelve is not a critical number; more or fewer ground pads G may be used). Such dedicated ground pads G are situated within the magnetic loop formed by the ring of the die seal 202, and at least some of the dedicated pads G are preferably located near the die seal 202 and between connection pads for circuit connections (e.g., between CP and P1, and between CP and P2). There may be other, general ground pads used for other circuit purposes and located elsewhere on the die IC 200, but those have been omitted from the figure for clarity.

Each of the illustrated dedicated ground pads G includes a pair of switches. A die seal grounding switch $S_{DSn,m}$ is connected between each ground pad G and an adjacent extent of the die seal 202, where n designates an associated path (Path1 or Path2 in this case) and m designates a sequence number (1 to 6 in this case). A path grounding switch $S_{Pn,m}$ is connected between each ground pad G and an adjacent extent of an associated signal path; again, n designates the associated path (Path1 or Path2 in this case) and m designates a sequence number (1 to 6 in this case). The switches $S_{DSn,m}$ and $S_{Pn,m}$ are typically implemented as field effect transistors (FETs) controlled by other circuitry (not shown); for simplicity, the switches are shown schematically rather than as physical structures on the IC die 200. However, the invention is not limited to FET switches, but encompasses other switch technologies that exhibit capacitive coupling characteristics, such as MEMS switches.

With two switches per ground pad G, four switch states are possible, as set forth in TABLE 1:

TABLE 1

| $S_{DSn,m}$ | $S_{Pn,m}$ | Result |
|---|---|---|
| OPEN | OPEN | no connection to die seal or corresponding path |
| OPEN | CLOSED | no connection to die seal, corresponding path locally grounded |
| CLOSED | OPEN | die seal locally grounded, no connection to corresponding path |
| CLOSED | CLOSED | die seal locally grounded, corresponding path locally grounded |

Accordingly, when the IC die 200 is embedded in a grounded system (e.g., fully packaged and mounted on a printed circuit board), the die seal 202 may be selectively locally grounded at the connection points of the $S_{DSn,m}$ switches, and the signal paths Path1, Path2 may be selectively locally grounded at the connection points of corresponding $S_{Pn,m}$ switches. "Locally grounded" means that a region or extent surrounding a connection point is essentially at zero potential with respect to DC and/or low frequency signals, but that, due to the impedance of conductors and the behavior of RF signals, extents of the conductor further away from such connection points may not be fully grounded with respect to RF signals. In some embodiments, the dedicated grounding pads G may be used only for locally grounding the die seal 202 through the $S_{DSn,m}$ switches (i.e., the $S_{Pn,m}$ switches may be omitted).

At high radio frequencies (especially frequencies equal to or greater than about 10 GHz), the behavior of RF signals within a particular IC die 200 can vary widely depending on a number of factors, including parasitic energy coupling as described above. The location and connection state of grounding points within such an IC can have a significant effect on circuit performance. This characteristic can be used to "tune" an IC die 200 to mitigate the effects of parasitic coupling, to selective repurpose such parasitic coupling to generate a notch filter effect, and/or to improve isolation between signal ports.

It should be appreciated that the inventive concepts are not limited to SPDT RF switches, and are applicable to other RF switch architectures (e.g., SPnT switches) and other RF circuits, including (but not limited to) mixers, phase shifters, digital step attenuators, and digitally tunable capacitor and inductors and any combination of such circuits. As a matter of convenience only, the following examples are described as various configurations of the SPDT embodiment shown in FIG. 2.

Figure 3A:
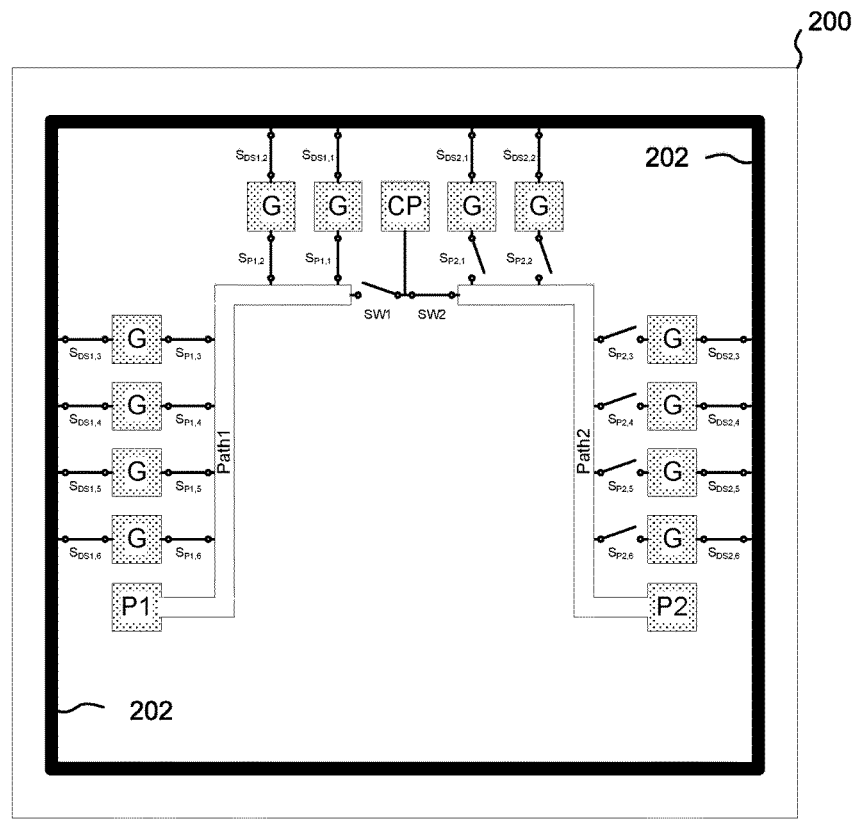
FIG. 3A is a top view of one embodiment of a stylized integrated circuit die having a peripheral multi-point selectably grounded die seal, with a first configuration of switchable grounding pads G.

FIG. 3A is a top view of one embodiment of a stylized integrated circuit die 200 having a peripheral multi-point selectably grounded die seal 202, with a first configuration of switchable grounding pads G. In this configuration, there is an active signal path between the common port CP and port P2: switch SW1 is open (thus behaving as a capacitor), nominally disconnecting the common port CP from port P1, and switch SW2 is closed (thus behaving as a low impedance resistor), connecting the common port CP to port P2. As one example, if the common port CP is connected to an external antenna and port P2 is connected to an RF receiver circuit, RF electromagnetic energy picked up by the antenna would flow along the intended signal path from the common port CP to the receiver port P2, while the signal path connection between the common port CP and a transmitter port P1 remains inactive.

In addition, in the illustrated configuration, the switches $S_{DSn,m}$ and $S_{Pn,m}$ have the states set forth in TABLE 2 ("0" means open and "1" means closed):

TABLE 2

| | Switch connection | | | |
|---|---|---|---|---|
| Sequence # m | $S_{DS1}$ | $S_{P1}$ | $S_{DS2}$ | $S_{P2}$ |
| 1 | 1 | 1 | 1 | 0 |
| 2 | 1 | 1 | 1 | 0 |
| 3 | 1 | 1 | 1 | 0 |
| 4 | 1 | 1 | 1 | 0 |
| 5 | 1 | 1 | 1 | 0 |
| 6 | 1 | 1 | 1 | 0 |

The configuration shown in FIG. 3A provides multiple grounding points for Path1 through the $S_{P1,m}$ switches, which helps improve isolation with respect to port P2. In general (but not necessarily always), the states of the path ground switches $S_{P1,m}$ and $S_{P2,m}$ will be complementary; that is, the path ground switches for the inactive path (or paths) will generally be ON (shunting the corresponding signal path to ground at one or more connection points), while the ground switches for the inactive path (or paths) will be OFF.

In addition, all of extents of the die seal 202 adjacent the dedicated grounding pads G are locally grounded through the $S_{DS1,m}$ and $S_{DS2,m}$ switches. Electromagnetic energy flow along Path2 will induce an opposite energy flow in an adjacent portion of the die seal 202; the magnitude of the induced parasitic energy flow is frequency dependent and also varies as a function of other parameters (e.g., the coupling factor for the IC die 200 substrate, the distance between the intended signal path and the adjacent die seal 202, etc.). However, such parasitic energy is quickly coupled to ground in this example through the grounding pads G, particularly those grounding pads G positioned between the common port CP and the receiver port P2 and coupled to the die seal 202 through the $S_{DS2,1}$ to $S_{DS2,6}$ switches. Accordingly, very little, if any, induced parasitic energy is propagated around the die seal 202 ring. In addition, the grounding pads G coupled to the die seal 202 through the $S_{DS1,1}$ to $S_{DS1,6}$ switches will also direct any locally induced parasitic energy flow within Path1 to circuit ground.

Figure 3B:
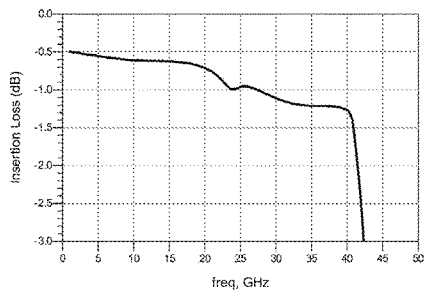
FIG. 3B is a graph of insertion loss (in dB) versus frequency (in GHz) for a modeled embodiment of the die and circuit configuration shown in FIG. 3A.
Figure 3C:
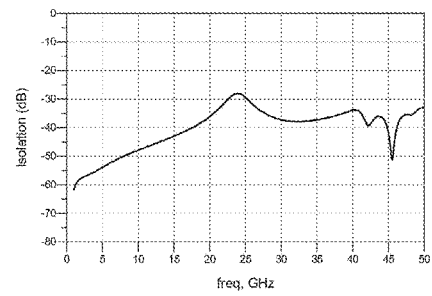
FIG. 3C is a graph of isolation (in dB) versus frequency (in GHz) for a modeled embodiment of the die and circuit configuration shown in FIG. 3A.

FIG. 3B is a graph of insertion loss (in dB) versus frequency (in GHz) for a modeled embodiment of the die and circuit configuration shown in FIG. 3A. FIG. 3C is a graph of isolation (in dB) versus frequency (in GHz) for a modeled embodiment of the die and circuit configuration shown in FIG. 3A. As FIG. 3B indicates, insertion loss (IL) is relatively steady from about 2 GHz to about 40 GHz, declining from about −0.5 dB to about −1.3 dB, while isolation ranges from about −60 dB to about −35 dB over the same frequency range, with a bump above −30 dB centered around about 24 GHz. Accordingly, the configuration shown in FIG. 3A principally serves to nullify or mitigate the propagation of parasitic energy flow around the die seal 202.

Figure 4A:
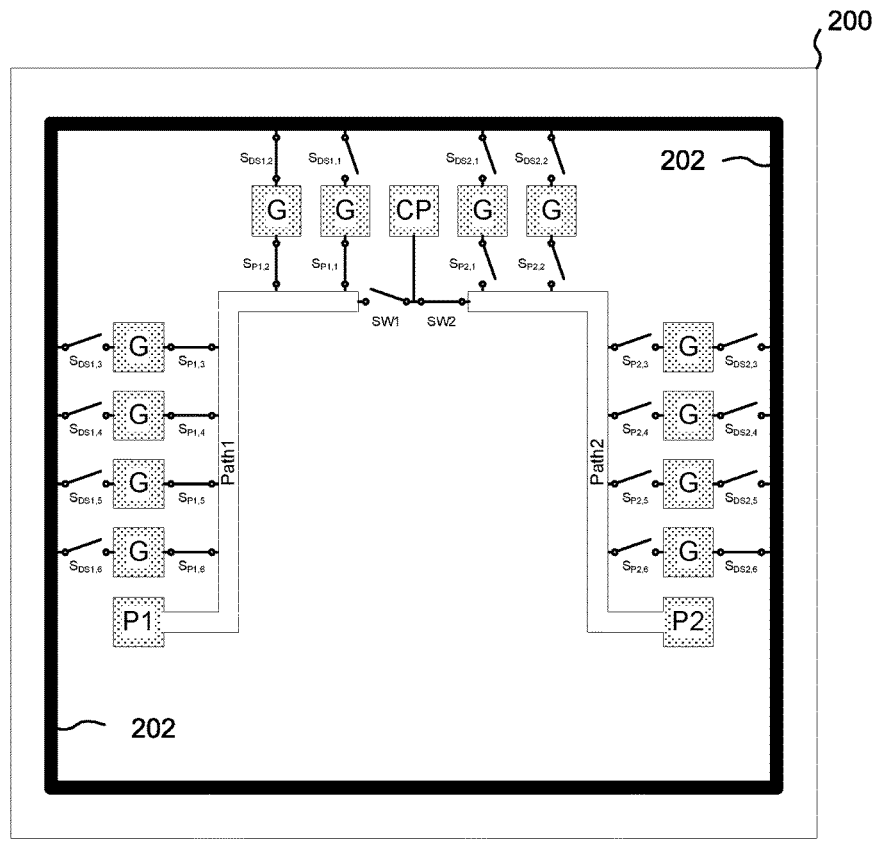
FIG. 4A is a top view of one embodiment of a stylized integrated circuit die having a peripheral multi-point selectably grounded die seal, with a second configuration of switchable grounding pads G.

FIG. 4A is a top view of one embodiment of a stylized integrated circuit die 200 having a peripheral multi-point selectably grounded die seal 202, with a second configuration of switchable grounding pads G. In this configuration, there is again a signal path between the common port CP and port P2: switch SW1 is open and switch SW2 is closed. In addition, in the illustrated configuration, the switches $S_{DSn,m}$ and $S_{Pn,m}$ have the states set forth in TABLE 3:

TABLE 3

| Sequence # m | Switch connection | | | |
|---|---|---|---|---|
| | $S_{DS1}$ | $S_{P1}$ | $S_{DS2}$ | $S_{P2}$ |
| 1 | 0 | 1 | 0 | 0 |
| 2 | 1 | 1 | 0 | 0 |
| 3 | 0 | 1 | 0 | 0 |
| 4 | 0 | 1 | 0 | 0 |
| 5 | 0 | 1 | 0 | 0 |
| 6 | 0 | 1 | 1 | 0 |

The configuration shown in FIG. 4A again provides multiple grounding points for Path1 through the $S_{P1,m}$ switches, which helps improve isolation with respect to port P2. However, only certain extents of the die seal 202 adjacent the dedicated grounding pads G are locally grounded through the $S_{DS1,m}$ and $S_{DS2,m}$ switches, namely, through the $S_{DS1,2}$ and $S_{DS2,6}$ switches. Accordingly, some induced parasitic energy is propagated around the die seal 202 ring, but at certain frequencies (specifically at about 35 GHz in this example), there is some internal cancellation of energy flow.

Figure 4B:
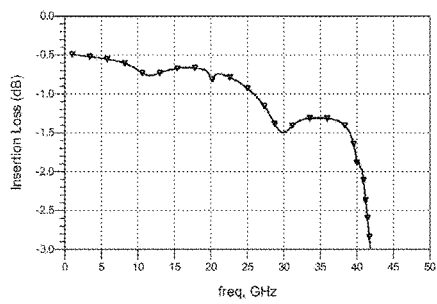
FIG. 4B is a graph of insertion loss (in dB) versus frequency (in GHz) for a modeled embodiment of the die and circuit configuration shown in FIG. 4A.
Figure 4C:
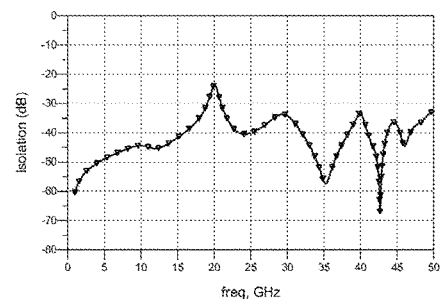
FIG. 4C is a graph of isolation (in dB) versus frequency (in GHz) for a modeled embodiment of the die and circuit configuration shown in FIG. 4A.

FIG. 4B is a graph of insertion loss (in dB) versus frequency (in GHz) for a modeled embodiment of the die and circuit configuration shown in FIG. 4A. FIG. 4C is a graph of isolation (in dB) versus frequency (in GHz) for a modeled embodiment of the die and circuit configuration shown in FIG. 4A. As FIG. 4B indicates, IL is relatively steady from about 2 GHz to about 25 GHz, where IL begins to increase significantly until about 40 GHz. Isolation is somewhat more varied than in FIG. 3C, but generally acceptable. Accordingly, by selectively coupling only certain grounding pads G to the die seal 202, a broad but shallow notch filter function is created by the configuration shown in FIG. 4A. Such a filter function may be useful in certain applications.

Figure 5A:
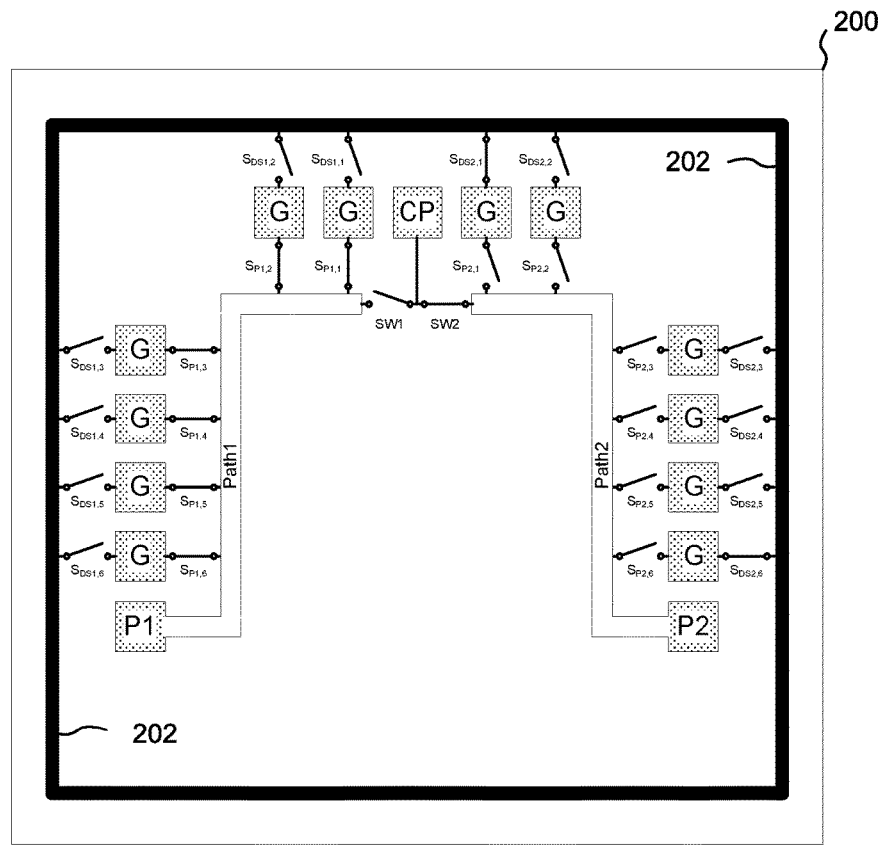
FIG. 5A is a top view of one embodiment of a stylized integrated circuit die having a peripheral multi-point selectably grounded die seal, with a third configuration of switchable grounding pads G.

FIG. 5A is a top view of one embodiment of a stylized integrated circuit die 200 having a peripheral multi-point selectably grounded die seal 202, with a third configuration of switchable grounding pads G. In this configuration, there is again a signal path between the common port CP and port P2: switch SW1 is open and switch SW2 is closed. In addition, in the illustrated configuration, the switches $S_{DSn,m}$ and $S_{Pn,m}$ have the states set forth in TABLE 4:

TABLE 4

| Sequence # m | Switch connection | | | |
|---|---|---|---|---|
| | $S_{DS1}$ | $S_{P1}$ | $S_{DS2}$ | $S_{P2}$ |
| 1 | 0 | 1 | 1 | 0 |
| 2 | 0 | 1 | 0 | 0 |
| 3 | 0 | 1 | 0 | 0 |
| 4 | 0 | 1 | 0 | 0 |
| 5 | 0 | 1 | 0 | 0 |
| 6 | 0 | 1 | 1 | 0 |

The configuration shown in FIG. 5A again provides multiple isolation-improving grounding points for Path1 through the $S_{P1,m}$ switches. As in FIG. 4A, only certain extents of the die seal 202 adjacent the dedicated grounding pads G are locally grounded through the $S_{DS1,m}$ and $S_{DS2,m}$ switches, namely, through the $S_{DS2,1}$ and $S_{DS2,6}$ switches. Thus, again, some induced parasitic energy is propagated around the die seal 202 ring, but at certain frequencies (specifically at about 25 GHz in this example), there is some internal cancellation of energy flow.

Figure 5B:
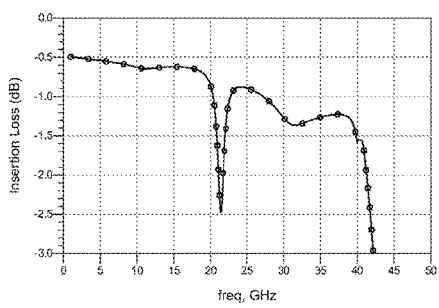
FIG. 5B is a graph of insertion loss (in dB) versus frequency (in GHz) for a modeled embodiment of the die and circuit configuration shown in FIG. 5A.
Figure 5C:
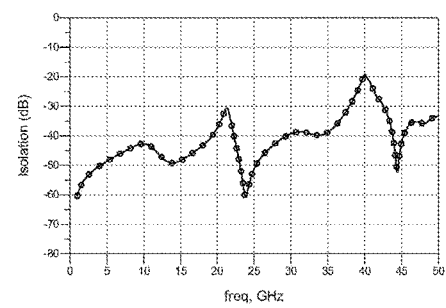
FIG. 5C is a graph of isolation (in dB) versus frequency (in GHz) for a modeled embodiment of the die and circuit configuration shown in FIG. 5A.

FIG. 5B is a graph of insertion loss (in dB) versus frequency (in GHz) for a modeled embodiment of the die and circuit configuration shown in FIG. 5A. FIG. 5C is a graph of isolation (in dB) versus frequency (in GHz) for a modeled embodiment of the die and circuit configuration shown in FIG. 5A. As FIG. 5B indicates, IL is relatively steady from about 2 GHz to about 20 GHz, where a sharp notch function is encountered until about 23 GHz. Isolation is more varied than in FIG. 3C, but generally acceptable, particularly below about 38 GHz. Accordingly, by selectively coupling only certain grounding pads G to the die seal 202 and shifting the combination of such grounding pads (contrast FIG. 4A, in which $S_{DS1,2}$ is ON and $S_{DS2,1}$ is OFF, with FIG. 5A, in which $S_{DS1,2}$ is OFF and $S_{DS2,1}$ is ON), a sharp notch filter function is created by the configuration shown in FIG. 5A. Such a sharp filter function may be particularly useful in certain applications.

Figure 6A:
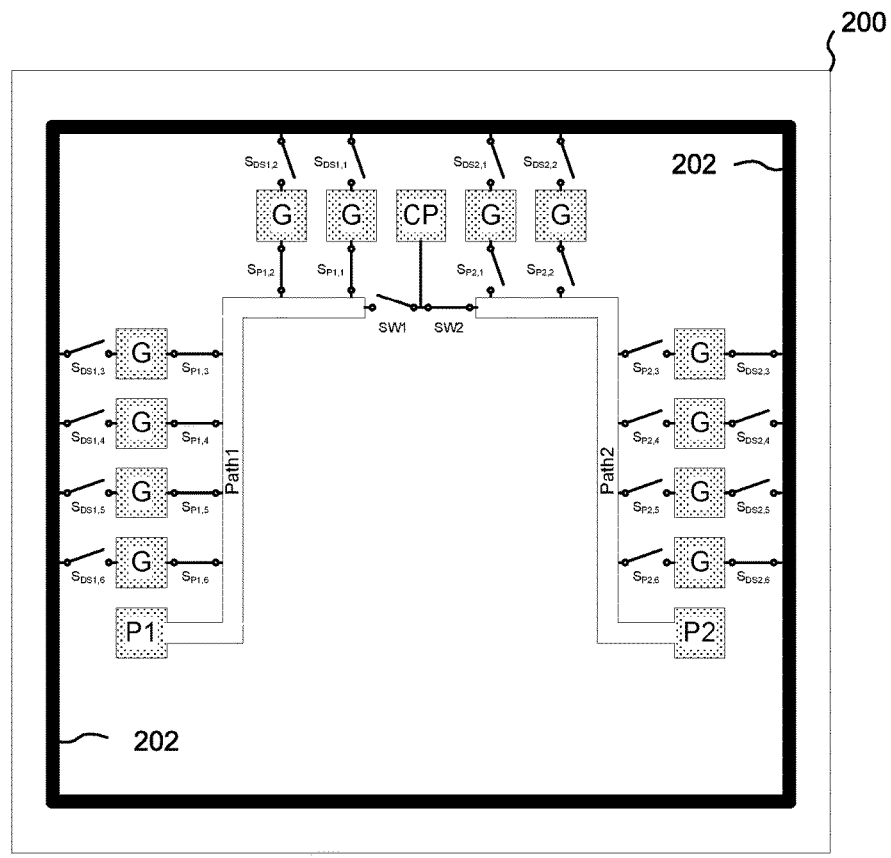
FIG. 6A is a top view of one embodiment of a stylized integrated circuit die having a peripheral multi-point selectably grounded die seal, with a fourth configuration of switchable grounding pads G.

FIG. 6A is a top view of one embodiment of a stylized integrated circuit die 200 having a peripheral multi-point selectably grounded die seal 202, with a fourth configuration of switchable grounding pads G. In this configuration, there is again a signal path between the common port CP and port P2: switch SW1 is open and switch SW2 is closed. In addition, in the illustrated configuration, the switches $S_{DSn,m}$ and $S_{Pn,m}$ have the states set forth in TABLE 5:

TABLE 5

| Sequence # m | Switch connection | | | |
|---|---|---|---|---|
| | $S_{DS1}$ | $S_{P1}$ | $S_{DS2}$ | $S_{P2}$ |
| 1 | 0 | 1 | 0 | 0 |
| 2 | 0 | 1 | 0 | 0 |
| 3 | 0 | 1 | 1 | 0 |
| 4 | 0 | 1 | 0 | 0 |
| 5 | 0 | 1 | 0 | 0 |
| 6 | 0 | 1 | 1 | 0 |

The configuration shown in FIG. 6A again provides multiple isolation-improving grounding points for Path1 through the $S_{P1,m}$ switches. As in FIG. 4A and FIG. 5A, only certain extents of the die seal 202 adjacent the dedicated grounding pads G are locally grounded through the $S_{DS1,m}$ and $S_{DS2,m}$ switches, namely, through the $S_{DS2,3}$ and $S_{DS2,6}$ switches. Thus, again, some induced parasitic energy is propagated around the die seal 202 ring, but at certain frequencies, there is some internal cancellation of energy flow.

Figure 6B:
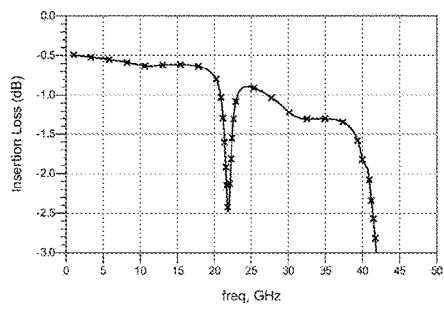
FIG. 6B is a graph of insertion loss (in dB) versus frequency (in GHz) for a modeled embodiment of the die and circuit configuration shown in FIG. 6A.
Figure 6C:
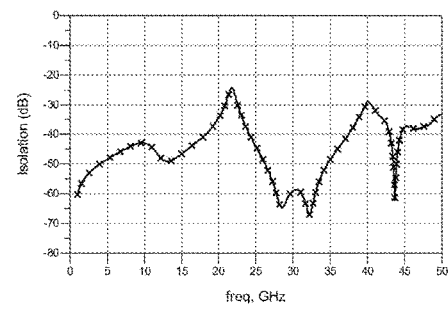
FIG. 6C is a graph of isolation (in dB) versus frequency (in GHz) for a modeled embodiment of the die and circuit configuration shown in FIG. 6A.

FIG. 6B is a graph of insertion loss (in dB) versus frequency (in GHz) for a modeled embodiment of the die and circuit configuration shown in FIG. 6A. FIG. 6C is a graph of isolation (in dB) versus frequency (in GHz) for a modeled embodiment of the die and circuit configuration shown in FIG. 6A. As FIG. 6B indicates, IL is relatively steady from about 2 GHz to about 20 GHz, where a sharp notch function is encountered until about 23 GHz. IL after about 23 GHz declines somewhat more smoothly than in FIG. 5B. Isolation is more varied than in FIG. 3C, but generally acceptable. Thus again, by selectively coupling only certain grounding pads G to the die seal 202 and shifting the combination of such grounding pads, a sharp notch filter function is created by the configuration shown in FIG. 6A. Notably, the filter function in FIG. 6B is nearly the same as the filter function in FIG. 5B, but is accomplished through a different combination of grounding points for the die seal 202 (through the $S_{DS2,1}$ and $S_{DS2,6}$ switches in FIG. 5A, and through the $S_{DS2,3}$ and $S_{DS2,6}$ switches in FIG. 6A). Further, as can be seen from FIGS. 6B and 6C in comparison with FIGS. 4B and 4C and FIGS. 5B and 5C, for a band of frequencies from about 25 to 35 GHz, isolation has been significantly improved while at the same time insertion loss is kept approximately the same.

It should be appreciated that it is possible that in a highly integrated circuit containing various RF sub-circuit blocks, one RF sub-circuit block may induce parasitic energy onto the die seal which can cause the performance degradation of another RF sub-circuit block as such energy is carried around the die seal. The current inventive concept can be applied to mitigate or overcome such degradation by selectively grounding the die seal 202 to selected grounding pads.

Programming

The connection of selected grounding pads G to adjacent extents of the die seal 202 may be optimized for a specific circuit configuration. For example, it may be more important to optimize isolation for a receiver path than for a transmitter path, and accordingly the selection of grounding pads G to connect to the die seal 202 may favor one signal port over the other. Such optimization may be performed by modeling a proposed circuit and IC layout.

Which ground pad switches to selectively connect to adjacent extents of the die seal 302 or of the signal paths Path1, Path2 may be determined by modelling a proposed circuit and IC layout and applying the results to all IC dies 200, or by testing samples of actual IC dies in different connection state configurations and applying the results to all production IC dies 200, or by testing and individually setting the connection state configuration for each fabricated IC die 200.

Selection of the ground pad switch states may be by control circuitry (not shown) configured to receive control words directly from an external source through a digital interface to set ground pad switches to a selected state (e.g., based on a frequency band combination selected by a user or other circuitry), or control words may be indirectly supplied from a look-up table (i.e., implemented as fuses, PROM, EEPROM, etc.) containing switch states for various RF band combinations. Switch states may also be set based on various control signals processed through combinatorial circuitry. Thus, program control of the die seal grounding switches and/or the path grounding switches can be based on a user selection or external (to the ground pad switches) control signals, or be automatically set in response to detected system states or parameters (e.g., detected signal frequency, signal strength, power consumption, IC device temperature, lookup values, etc.).

It is important to note that "ground" or "circuit ground" in the context of the invention refers to a ground connection suitable for RF circuitry, rather than to "digital" ground. Conventionally, a digital ground is used for a DC and/or low frequency digital circuit and/or as an electro-static discharge (ESD) return path. Such circuits in general do not carry a significant amount of root-mean square (RMS) current. Since a digital ground is used for DC and/or low frequencies and does not carry significant RMS current, only a few digital ground pad connections are generally needed. However, such connections (e.g., via a bond wire or flip chip bumps or pillars) can be electrically large at high RF frequencies (e.g., greater than about 10 GHz). If a die seal is tied to digital ground, the connections can act as an antenna and pick up parasitic energy induced by nearby signal paths. Accordingly, the grounding pads G and the grounding switch ties should be designed to take into account the grounding requirements of RF circuitry.

Methods

Another aspect of the invention includes a method for selectably grounding a die seal integrated circuit structure for RF circuits, including: providing an integrated circuit die having a die seal defining a ring on the integrated circuit die; providing a plurality of electrically conductive connection pads disposed on the integrated circuit die within the die seal ring; providing at least one ground pad, each disposed on the integrated circuit die adjacent a corresponding extent of the die seal ring and within the die seal ring, and configured to be electrically coupled to a circuit ground; and providing at least one die seal grounding switch, each disposed on the integrated circuit die and electrically connected to a corresponding ground pad and to an adjacent extent of the die seal ring, for selectively coupling the corresponding ground pad to the adjacent extent of the die seal ring.

Other aspects of the above method include providing at least one path grounding switch, each disposed on the integrated circuit die and electrically connected to a corresponding ground pad and to an adjacent extent of a corresponding signal path, for selectively coupling the corresponding ground pad to the adjacent extent of the corresponding signal path; applying a filter function to a signal communicated between at least two of the plurality of electrically conductive connection pads by selectively activating the at least one die seal grounding switch to connect the corresponding ground pad to an adjacent extent of the die seal ring; the integrated circuit die further including at least one electrical circuit coupled to at least one electrically conductive connection pad; the integrated circuit die further including at least one electrical circuit coupled between at least two electrically conductive connection pads; further including positioning at least one ground pad between an adjacent pair of the plurality of electrically conductive connection pads; and the integrated circuit die being a silicon-on-insulator (SOI) substrate.

Yet another aspect of the invention includes a method for selectably grounding a die seal integrated circuit structure for RF circuits, including: providing an integrated circuit die having a die seal defining a ring on the integrated circuit die; providing at least one ground pad, each disposed on the integrated circuit die adjacent a corresponding extent of the die seal ring and within the die seal ring, and configured to be electrically coupled to a circuit ground; providing at least one die seal grounding switch, each disposed on the integrated circuit die and electrically connected to a corresponding ground pad and to an adjacent extent of the die seal ring, for selectively coupling the corresponding ground pad to the adjacent extent of the die seal ring; providing at least one path grounding switch, each disposed on the integrated circuit die and electrically connected to a corresponding ground pad and to an adjacent extent of a corresponding signal path, for selectively coupling the corresponding ground pad to the adjacent extent of the corresponding signal path; providing a plurality of electrically conductive connection pads disposed on the integrated circuit die within the die seal ring, at least one pair of the electrically conductive connection pads defining a corresponding signal path; locating at least one corresponding ground pad adjacent the corresponding signal path and between the corresponding pair of electrically conductive connection pads; and applying a filter function to a signal communicated along the signal path by selectively connecting the corresponding ground pad through the corresponding die seal grounding switch to an adjacent extent of the die seal ring.

Other aspects of the above method include isolating at least one signal path from other signal paths by selectively connecting the at least one corresponding ground pad through the corresponding path grounding switch to an adjacent extent of the signal path.

Still another aspect of the invention includes a method for selectably grounding a die seal integrated circuit structure for RF circuits, including: providing an integrated circuit die having a die seal defining a ring on the integrated circuit die and a plurality of electrically conductive connection pads disposed on the integrated circuit die within the die seal ring; providing at least one ground pad, each disposed on the integrated circuit die adjacent a corresponding extent of the die seal ring and within the die seal ring, and configured to be electrically coupled to a circuit ground; and selectively coupling at least one of the ground pads to the corresponding adjacent extent of the die seal ring. Another aspect of the above method includes selectively coupling at least one of the ground pads to an adjacent extent of a corresponding signal path.

Fabrication Technologies and Options

As should be readily apparent to one of ordinary skill in the art, various embodiments of the invention can be implemented to meet a wide variety of specifications. Additional circuit components may be added to enhance the capabilities of the disclosed circuits and/or to provide additional functional without significantly altering the functionality of the disclosed circuits.

Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (particularly frequencies in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A selectably grounded die seal integrated circuit structure for RF circuits, including:
   (a) an integrated circuit die;
   (b) a die seal defining a ring on the integrated circuit die;
   (c) a plurality of electrically conductive connection pads disposed on the integrated circuit die within the die seal ring;
   (d) at least one ground pad, each disposed on the integrated circuit die adjacent a corresponding extent of the die seal ring and within the die seal ring, and configured to be electrically coupled to a circuit ground; and
   (e) at least one die seal grounding switch, each disposed on the integrated circuit die and electrically connected to a corresponding ground pad and to an adjacent extent of the die seal ring, for selectively connecting the corresponding ground pad to the adjacent extent of the die seal ring.

2. The invention of claim 1, further including at least one path grounding switch, each disposed on the integrated circuit die and electrically connected to a corresponding ground pad and to an adjacent extent of a corresponding signal path, for selectively connecting the corresponding ground pad to the adjacent extent of the corresponding signal path.

3. The invention of claim 1, wherein a filter function is applied to a signal communicated between at least two of the plurality of electrically conductive connection pads by selectively activating the at least one die seal grounding switch to connect the corresponding ground pad to an adjacent extent of the die seal ring.

4. The invention of claim 1, wherein the integrated circuit die further includes at least one electrical circuit coupled to at least one electrically conductive connection pad.

5. The invention of claim 1, wherein the integrated circuit die further includes at least one electrical circuit coupled between at least two electrically conductive connection pads.

6. The invention of claim 1, wherein at least one ground pad is positioned between an adjacent pair of the plurality of electrically conductive connection pads.

7. The invention of claim 1, wherein the integrated circuit die is a silicon-on-insulator (SOI) substrate.

8. A selectably grounded die seal integrated circuit structure for RF circuits, including:
   (a) an integrated circuit die;
   (b) a die seal defining a ring on the integrated circuit die;
   (c) at least one ground pad, each disposed on the integrated circuit die adjacent a corresponding extent of the die seal ring and within the die seal ring, and configured to be electrically coupled to a circuit ground;
   (d) at least one die seal grounding switch, each disposed on the integrated circuit die and electrically connected to a corresponding ground pad and to an adjacent extent of the die seal ring, for selectively connecting the corresponding ground pad to the adjacent extent of the die seal ring;
   (e) at least one path grounding switch, each disposed on the integrated circuit die and electrically connected to a corresponding ground pad and to an adjacent extent of a corresponding signal path, for selectively connecting the corresponding ground pad to the adjacent extent of the corresponding signal path; and
   (f) a plurality of electrically conductive connection pads disposed on the integrated circuit die within the die seal ring, at least one pair of the electrically conductive connection pads defining a corresponding signal path;
   wherein at least one corresponding ground pad is located adjacent the corresponding signal path and between the corresponding pair of electrically conductive connection pads, and wherein a filter function is applied to a signal communicated along the signal path by selectively connecting the corresponding ground pad through the corresponding die seal grounding switch to an adjacent extent of the die seal ring.

9. The invention of claim 8, wherein at least one signal path is isolated from other signal paths by selectively connecting the at least one corresponding ground pad through the corresponding path grounding switch to an adjacent extent of the signal path.

10. A method for selectably grounding a die seal integrated circuit structure for RF circuits, including:
    (a) providing an integrated circuit die having a die seal defining a ring on the integrated circuit die;
    (b) providing a plurality of electrically conductive connection pads disposed on the integrated circuit die within the die seal ring;
    (c) providing at least one ground pad, each disposed on the integrated circuit die adjacent a corresponding extent of the die seal ring and within the die seal ring, and configured to be electrically coupled to a circuit ground; and
    (d) providing at least one die seal grounding switch, each disposed on the integrated circuit die and electrically connected to a corresponding ground pad and to an adjacent extent of the die seal ring, for selectively connecting the corresponding ground pad to the adjacent extent of the die seal ring.

11. The method of claim 10, further including providing at least one path grounding switch, each disposed on the integrated circuit die and electrically connected to a corresponding ground pad and to an adjacent extent of a corresponding signal path, for selectively connecting the corresponding ground pad to the adjacent extent of the corresponding signal path.

12. The method of claim 10, further including applying a filter function to a signal communicated between at least two of the plurality of electrically conductive connection pads by selectively activating the at least one die seal grounding switch to connect the corresponding ground pad to an adjacent extent of the die seal ring.

13. The method of claim 10, wherein the integrated circuit die further includes at least one electrical circuit coupled to at least one electrically conductive connection pad.

14. The method of claim 10, wherein the integrated circuit die further includes at least one electrical circuit coupled between at least two electrically conductive connection pads.

15. The method of claim 10, further including positioning at least one ground pad between an adjacent pair of the plurality of electrically conductive connection pads.

16. The method of claim 10, wherein the integrated circuit die is a silicon-on-insulator (SOI) substrate.

17. A method for selectably grounding a die seal integrated circuit structure for RF circuits, including:
    (a) providing an integrated circuit die having a die seal defining a ring on the integrated circuit die;
    (b) providing at least one ground pad, each disposed on the integrated circuit die adjacent a corresponding extent of the die seal ring and within the die seal ring, and configured to be electrically coupled to a circuit ground;
    (c) providing at least one die seal grounding switch, each disposed on the integrated circuit die and electrically connected to a corresponding ground pad and to an adjacent extent of the die seal ring, for selectively connecting the corresponding ground pad to the adjacent extent of the die seal ring;
    (d) providing at least one path grounding switch, each disposed on the integrated circuit die and electrically connected to a corresponding ground pad and to an adjacent extent of a corresponding signal path, for selectively connecting the corresponding ground pad to the adjacent extent of the corresponding signal path;
    (e) providing a plurality of electrically conductive connection pads disposed on the integrated circuit die within the die seal ring, at least one pair of the electrically conductive connection pads defining a corresponding signal path;
    (f) locating at least one corresponding ground pad adjacent the corresponding signal path and between the corresponding pair of electrically conductive connection pads; and
    (g) applying a filter function to a signal communicated along the signal path by selectively connecting the corresponding ground pad through the corresponding die seal grounding switch to an adjacent extent of the die seal ring.

18. The method of claim 17, further including isolating at least one signal path isolated from other signal paths by selectively connecting the at least one corresponding ground pad through the corresponding path grounding switch to an adjacent extent of the signal path.

19. A method for selectably grounding a die seal integrated circuit structure for RF circuits, including:
    (a) providing an integrated circuit RF circuit die having a die seal defining a ring on the integrated circuit RF circuit die and a plurality of electrically conductive connection pads disposed on the integrated circuit RF circuit die within the die seal ring;
    (b) providing at least one ground pad, each disposed on the integrated circuit RF circuit die adjacent a corresponding extent of the die seal ring and within the die seal ring, and configured to be electrically coupled to a circuit ground; and
    (c) selectively connecting at least one of the ground pads to the corresponding adjacent extent of the die seal ring by means of a switch coupled between such at least one ground pad and such corresponding adjacent extent of the die seal ring.

20. The method of claim 19, further including selectively coupling at least one of the ground pads to an adjacent extent of a corresponding signal path by means of a switch coupled between such at least one ground pad and such adjacent extent of the corresponding signal path.

* * * * *